US006642448B1

United States Patent
Loose et al.

(10) Patent No.: US 6,642,448 B1
(45) Date of Patent: Nov. 4, 2003

(54) CIRCUIT CARD WITH POTTING CONTAINMENT FENCE APPARATUS

(75) Inventors: Robert Loose, Cary, NC (US); Scott Eastman, Cary, NC (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 10/350,592

(22) Filed: Jan. 23, 2003

Related U.S. Application Data (62) Division of application No. 09/608,932, filed on Jun. 30, 2000, now Pat. No. 6,541,701.

(51) Int. Cl.[7] ............................ H05K 5/06; H01L 23/28

(52) U.S. Cl. .................................. 174/52.2; 264/272.11

(58) Field of Search ............................... 174/52.2, 52.4; 257/787, 788; 264/272.11, 272.14, 272.17, 272.18

(56) References Cited

U.S. PATENT DOCUMENTS

| | | | | |
|---|---|---|---|---|
| 3,689,683 A | * | 9/1972 | Paletto et al. | 174/52.2 |
| 4,819,041 A | | 4/1989 | Redmond | |
| 4,916,522 A | | 4/1990 | Cohn | |
| 5,977,622 A | | 11/1999 | Mertol | |
| 6,111,324 A | * | 8/2000 | Sheppard et al. | 257/787 |

\* cited by examiner

Primary Examiner—Hung V. Ngo
(74) Attorney, Agent, or Firm—Hickman Palermo Truong & Becker LLP (57) ABSTRACT

A fluid containment fence apparatus provides a border around the perimeter of an area to be potted on one or both sides of a circuit board. First, or first and second (top and bottom), containment walls are secured in place using interlocking elements integral to the walls such that no external fasteners are needed. The interlocking elements permit snug adhesion of the fence to the board even when the board has variations in thickness. The interlocking elements extend through and interlock through engagement with another fence or the board. The size of the holes is minimized. As a result, a minimum amount of board space is occupied by the fence, and the overall size of the board is maintained.

16 Claims, 5 Drawing Sheets

CIRCUIT CARD WITH POTTING CONTAINMENT FENCE APPARATUS

CROSS REFERENCE TO RELATED APPLICATIONS

This application is a divisional of and claims the benefit of priority under 35 U.S.C. §120 from U.S. patent application No. 09/608,932, filed on Jun. 30, 2000 U.S. Pat. No. 6,541,701, which is incorporated by reference in its entirety for all purposes, as if fully set forth herein.

FIELD OF THE INVENTION

The present invention relates to an electronic circuit card and associated manufacturing apparatus. The invention relates more specifically to apparatus for containing a hard-curing liquid material that is deposited over a circuit board after active components have been installed on the board.

BACKGROUND OF THE INVENTION

Electronic products such as circuit boards ("cards") that are used in cryptographic computer equipment owned or operated by military and government agencies are required to conform to certain government standards. An example of such standards is the guidelines provided in Federal Information Processing Standards (FIPS) Publication 140-1. FIPS 140-1 defines four (4) increasingly stringent levels of security. One requirement of the FIPS 140-1 guidelines is that a manufacturer must cover a circuit board containing cryptographic circuitry with a hard opaque material that discourages tampering with, disabling or destroying the circuitry. The material also serves to show evidence of attempted tampering.

Covering circuit board components with such materials may also be desirable for reasons other than conformance to FIPS 140-1. For example, a board manufacturer may wish to preserve trade secret information by preventing competitors from determining the components and interconnections that are used in a board. Also, a manufacturer may wish to protect the components or prevent end users or consumers from tampering with or damaging the board or its components. To address any of these issues, in the manufacturing process a board may be covered with any of a variety of liquid materials that cure to a hard, non-conductive, opaque state. This process is known as "potting" the board, and the liquid is called a potting fluid.

A preferred material is an epoxy resin, which is poured over the circuit board in a liquid state. The epoxy then hardens, forming a solid, opaque barrier over and around the electronic components on the circuit board. The epoxy is electrically non-conductive, but is thermally conductive and aids in cooling of the components. Unfortunately, the potting process is difficult to accomplish when a circuit board has active components or other modules on both sides.

Accordingly, there is a need for an apparatus or method to consistently pot one or both sides of a board while minimizing the cost and complexity of the process. There is also a need for a method that can maintain a consistent minimal depth of epoxy over the tallest component on the board.

There is also a need to provide such an apparatus or method that does not result in an increase in the length or width of the circuit board.

One method used to solve these problems in the past is known as "dam and fill." In this process, a first material is dispensed around the perimeter of the area to be coated. The first material hardens, and then acts as a dam or barrier to a second material, typically epoxy, that is used to fill the area within the first material. This process requires extra time, because the first material must cure before the potting material can be applied. Additional dispensing equipment and material is needed. Further, the finished product is not as "clean" looking. This method also is not well suited for applications where the depth of the epoxy may be significant.

Another alternative is to suspend the components to be epoxied in a cavity that is entirely filled. This method becomes complicated for boards that have holes or connectors that must not be covered. For example, there may be mounting holes that are used to affix the board in a larger system, or connectors that carry electrical signals from the board to other components of the system. Further, this method generally increases the overall size of the board.

Still another alternative potting method would be similar to injection molding. A mold could be created to completely contain the board and epoxy. The board would be placed inside the mold and the mold would be closed. Epoxy or other potting material would be introduced into the mold through gates or ports in the mold. When the potting material had cured, the mold would be opened and the potted board would be removed. However, this method would have numerous disadvantages. For example, special tooling would be required. Further, since hardened epoxy cannot be melted, keeping the gates or ports free of hardened epoxy would be extremely complicated. This might require flushing the gates or ports, or a mechanical design that somehow ensures that the gates or ports remain clean.

Based on the foregoing, there is a clear need in this field for an apparatus or method of containing hard-curing materials that are deposited on a board in a liquid state. There is a particular need for an apparatus or method to pot both sides of a board while minimizing the cost and complexity of the process, and that does not result in an increase in the length or width of the circuit board.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

A circuit card and apparatus for containing potting fluid on a board of components is described. In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

GENERAL OVERVIEW

A fluid containment fence apparatus provides a border around the perimeter of an area to be potted on either or both sides of a circuit board. First, or first and second (top and bottom), containment walls are secured in place using protrusions or interlocking elements integral to the walls such that no external fasteners are needed. The interlocking elements permit snug adhesion of the fence to the board even when the board has variations in thickness. The interlocking elements extend through and interlock through holes in the board. The size of the holes is minimized. As a result, a minimum amount of board space is occupied by the fence, and the overall size of the board is maintained.

According to one aspect of the invention, a circuit card includes a containment fence. The circuit card includes a board having circuit components arranged on at least an upper face of the board to be encased in a cured potting fluid. The board also has a cavity on the upper face of the board. The fence includes a first wall with segments that form a closed first polygon providing containment for the cured potting fluid on the upper face of the board. The fence includes at least one boss for engaging the cavity in the board, and at least one boss extending inwardly or outwardly from a segment of the plurality of segments. The protrusion is on a lower face of the first wall. The first wall is formed of material that is rigid before the protrusion is engaged in the cavity.

According to another aspect of the invention, a circuit card includes a fence with two walls. The circuit card includes a board having circuit components arranged on both an upper face and a lower face of the board, the components encased in a cured potting fluid. The board also includes a hole passing from the upper surface of the board to the lower surface of the board. A first wall of the fence has segments disposed to form a closed first polygon providing containment for the cured potting fluid on the upper face of the board. The first wall also has an element of a pair of interlocking elements. The element is disposed on a lower face of the first wall. A second wall of the fence has segments disposed to form a closed second polygon providing containment for the cured potting fluid on the lower face of the board. The second wall has a complementary element of the pair of interlocking elements. The complementary element is disposed on an upper surface of the second wall. The element engages the complementary element through a corresponding hole in the board. At least one wall of the first wall and the second wall includes a boss extending inwardly or outwardly from a segment of the respective plurality of segments.

STRUCTURAL OVERVIEW

A fluid containment fence apparatus provides a border around the perimeters of areas to be potted on both sides of a board. First and second (top and bottom) containment walls are secured in place using interlocking elements integral to the walls such that no external fasteners are needed. The interlocking elements permit snug adhesion of the fence to the board even when the board has variations in thickness. The interlocking elements extend through and interlock through holes in the board. The size of the holes is minimized. As a result, a minimum amount of board space is occupied by the fence, and the overall size of the board is maintained.

The fence snaps together through holes in the circuit card using the interlocking elements. The geometry of the interlocking elements is such that they allow for variations in the board thickness typical of the printed circuit board fabrication process. The fence sandwiches the board so that when epoxy is poured, it does not leak beyond the boundary of the fence.

The fence reduces the cost of overall board assembly by incorporating all features necessary for the joining of the two walls of the fence through the card. There are no additional mechanical fasteners. Further cost reduction is realized by integrating standoffs into the fence itself. The fence incorporates visual markers to indicate the proper fill level for the epoxy. These markers also serve a secondary function as platforms upon which labels may be placed. For example, labels bearing a board part number, date code, serial number, etc., may be affixed to the platforms.

FENCE APPARATUS

An embodiment of a containment fence apparatus is now described in detail with reference to the drawing figures. In general, a first containment wall of the fence, intended for use on the top side (the upper surface) of a circuit board, is shown in FIG. 1A, FIG. 1B, FIG. 2, FIG. 3A, FIG. 3B, FIG. 4A, and FIG. 4B. A second wall of the containment fence, intended for use on the bottom side (the lower surface) of a circuit board, is shown in FIG. 5A, FIG. 5B, FIG. 6, FIG. 7A, and FIG. 7B.

Figure 1A:
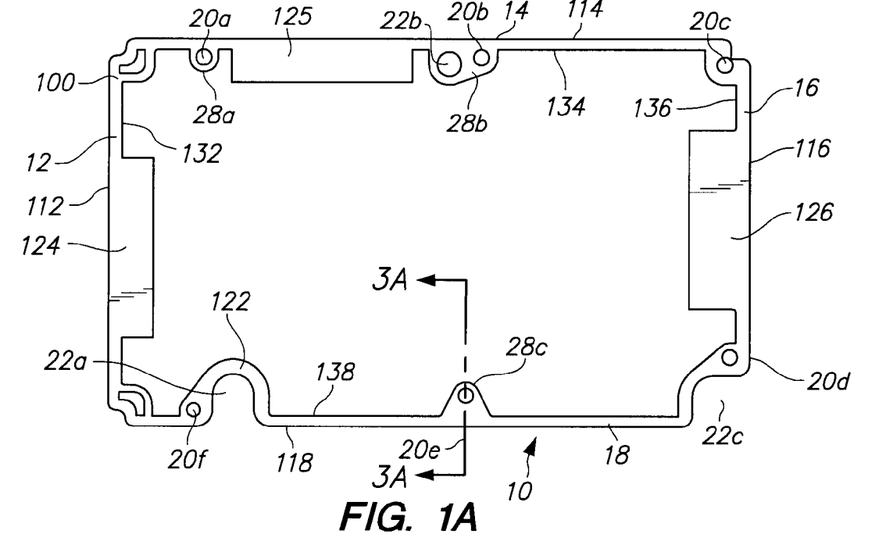
FIG. 1A is a top plan view of a first wall of a containment fence intended for use on the upper surface of a circuit board according to one embodiment of the present invention.

FIG. 1A is a top plan view of a first wall of the containment fence intended for use on the top side of a circuit board. A first wall 10 is formed in a generally rectangular form for attachment to the perimeter of a rectangular section of a circuit board to be encased in cured potting fluid, such as hardened epoxy. Any other closed geometry, such as a polygon, may be used in other embodiments. Containment fence first wall 10 comprises two non-elongated wall segments 12, 16 and elongated wall segments 14, 18 joined at their ends to form a rectangle. In the preferred embodiment, containment fence wall 10 is formed as an integral unit made of material such as rigid polystyrene, ABS, other plastics, metals, ceramics, composites, etc. Porous or non-porous materials may be used. The material should be sufficiently rigid, but must also have sufficient elastic properties to allow for interlocking protuberances to mate. The material may have rigidity perpendicular to the board surface-that improves the planarity of the board when it is sandwiched between the fences. The particular material is not critical, provided that it is rigid enough to contain a layer of resin or other viscous liquid material that is poured within its walls during the potting process.

A plurality of interlocking holes have openings 20a, 20b, 20c, 20d, 20e, 20f disposed about the upper face 100 of wall 10. In a preferred embodiment, each of the holes indicated by openings 20a, 20b, 20c, 20d, 20e, 20f extends through a boss, e.g., 28a or 28b, that extends inwardly from one of the wall segments 12, 14, 16, 18. In this way, the holes are disposed in wall 10 without extending outside the periphery of wall 10 and thereby increasing its size and impact on non-encased areas of the circuit board.

Each hole, of the plurality of interlocking holes, represents one interlocking element of a pair of interlocking elements. The other interlocking element in this embodiment is a protuberance that locks into place when inserted into the hole, as will be described below in relation to FIG. 6, FIG. 7A and FIG. 7B. In another embodiment, one or more protuberances are used in place of one or more of the interlocking holes on the first wall. In still another embodiment, any pair of interlocking elements known in the art replaces the interlocking hole and protuberance of the current embodiment.

Although described as a rectangle with interior bosses, the first wall 10 is more properly termed a polygon because of additional segments interposed at the four corners and in the vicinity of the detour 122 around an attachment area 22a. An attachment area is a place on the circuit board where an external device is attached to the circuit board either mechanically or electronically. In general, attachment areas are excluded from the area inside the walls of the containment fence where potting fluid is poured. For example, in FIG. 1A, attachment area 22a is outside detour 122 of the first wall 10, attachment area 22c is outside a corner of the first wall 10, and attachment area 22b is protected from potting fluid by boss 28b.

FIG. 1A shows the upper face 100 of the first wall 10. Each wall segment of the wall 10 has an outside face and an inside face. In particular, wall segment 12 has outside face 112 and inside face 132, wall segment 14 has outside face 114 and inside face 134, wall segment 16 has outside face 116 and inside face 136, and wall segment 18 has outside face 118 and inside face 138.

FIG. 1A also shows three platforms 124, 125 and 126 attached to the wall 10. The platforms 124, 125 and 126 serve two functions for the first wall 10 of the containment fence. The upper surface of a platform, e.g., 124, serves as a visual marker to indicate a fill level for the potting fluid. The same upper surface of the same platform, e.g., 124, also provides an area for fixing a label to the circuit board that will be visible after components on the board have been encased in cured potting fluid. In the current embodiment, the platform extends along a portion of the inside face of a segment of the wall, is substantially perpendicular to the inside face of the segment of the wall, and is spaced apart from a bottom edge of the inside face of the segment of the wall, as will be shown in more detail below. For example, platform 124 extends along a portion of inside face 132 of segment 12 and is substantially perpendicular to face 132 of segment 12.

Figure 3A:
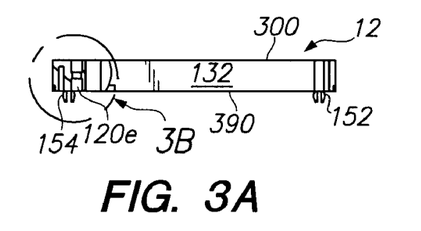
FIG. 3A is a part section of the elongated segment of FIG. 2 and a part side elevation view of a non-elongated segment of the fence of FIG. 1, the latter view from inside the fence.

FIG. 1A also shows the location and direction of the partial sectional view presented in FIG. 3A.

Figure 1B:
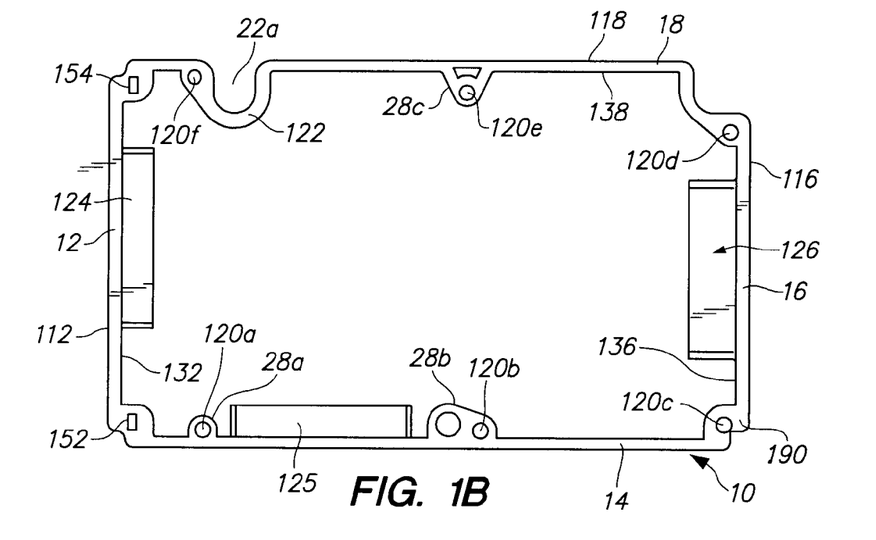
FIG. 1B is a bottom plan view of the first wall of the containment fence of FIG. 1A intended for use on the upper surface of a circuit board.

FIG. 1B is a bottom plan view of the first wall 10 of the containment fence intended for use on an upper surface of the circuit board. This shows the lower surface 190 of the first wall 10. Because of the new view, corresponding features from the top plan view will appear swapped in position; for example detour 122 appears at the top of FIG. 1B whereas it appears at the bottom of FIG. 1A. Apparent in this view is the lower surface of bosses 28a, 28b and 28c. Also apparent, are the lower surfaces of platforms 124, 125 and 126. Note that the lower surfaces of the platforms 124, 125 and 126 are not flush with the lower surface 190 of the wall 10, but are spaced apart from the lower surface 190 of wall 10 toward the upper surface (100 in FIG. 1A) of wall 10.

The interlocking holes 120 have openings on the lower face of the first wall 10. In this embodiment, the interlocking holes have openings (20 in FIG. 1A) on the upper face (100 in FIG. 1A) of first wall 10, and pass through the first wall 10 to the openings on the lower surface 190 of the first wall 10. In another embodiment there need not be an opening (20 in FIG. 1A) on the upper surface (100 in FIG. 1A) of the first wall 10, because the complementary interlocking element, the protuberance, enters the interlocking hole 120 from below the circuit board through the lower face 190 of the first wall 10. More detail on the structure of the interlocking hole 120 in the wall 10 is given below in relation to FIG. 3B.

FIG. 1B also shows the locations of two protrusions 152 and 154. In this embodiment, protrusions 152 and 154 fit into corresponding holes or cavities in a circuit board to position the first wall 10 with respect to the circuit board. In another embodiment, the containment fence does not include a second wall, and one or more protrusions, like protrusions 152 and 154, are used to position and hold the first wall in place while a potting fluid is poured inside the wall onto the upper surface of the circuit board. This alternate embodiment is not taught in the methods described in the background, because the fence of this alternate embodiment is pre-formed of rigid material, including the protrusions, before being inserted on the circuit board. The background teaches applying a soft material to the circuit board to form a dam, then allowing the soft material to cure, then pouring in the potting fluid. Further detail on the protrusions is described in relation to FIG. 3B, FIG. 4B.

Figure 2:
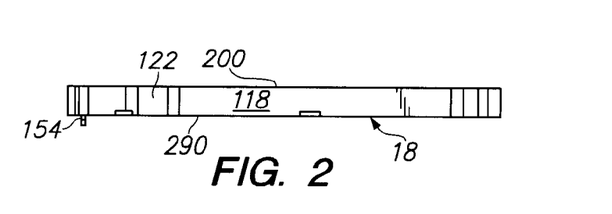
FIG. 2 is a side elevation view of an elongated segment of the fence of FIG. 1A.

FIG. 2 is a side elevation view of the elongated segment 18 of wall 10 of the containment fence, as viewed from the outside. Thus, FIG. 2 shows outside face 118 of segment 18 of the first wall 10. The outside face 118 meets the upper face (100 in FIG. 1A) of the first wall 10 along the line of the upper edge 200. The outside face 118 meets the lower face (190 in FIG. 1A) of the first wall 10 along the line of the lower edge 290. Also apparent in FIG. 2 are the outside face of detour 122, and protrusion 154. When attached to a circuit board, protrusion 154 engages a hole or cavity in the circuit board, and lower edge 290 lies adjacent to the upper surface of the circuit board.

FIG. 3A is a partial section of the elongated segment 18 of FIG. 2, and a partial side elevation view of inside face 132 of wall segment 12 of the containment fence. The relationship of the view of FIG. 3A to the containment fence is shown in FIG. 1A.

The inside face 132 meets the upper face (100 in FIG. 1A) of first wall 10 along the line of the upper edge 300. The inside face 132 meets the lower face (190 in FIG. 1A) of the first wall 10 along the line of the lower edge 390. FIG. 3A also shows protrusions 152, 154. When attached to a circuit board, protrusions 152 and 154 engage corresponding holes in the circuit board, and lower edge 390 lies adjacent to the upper surface of the circuit board. FIG. 3A further shows the interlocking hole 120e. Details of interlocking hole 120e and protrusion 154 are given in FIG. 3B.

Figure 3B:
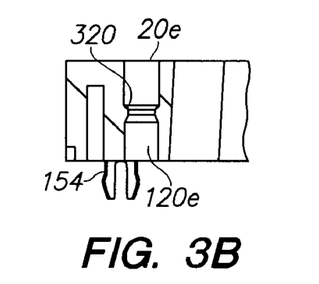
FIG. 3B is a part section of the elongated segment, as shown in FIG. 3A, illustrating details of a protrusion and interlocking hole.

FIG. 3B is a section of the elongated segment 18 appearing in FIG. 3A, and showing details of a protrusion 154 and an interlocking hole 120e. FIG. 3B shows that interlocking hole 120e becomes narrower at neck 320 and then widens again above neck 320. FIG. 3 B. also shows the opening 20e of the interlocking hole 120e at the upper surface (100 in FIG. 1A) of the first wall 10.

Figure 4A:
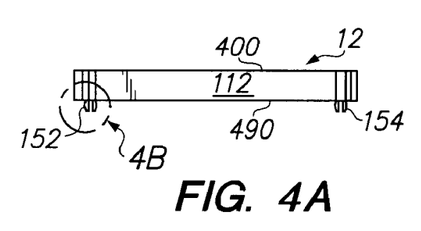
FIG. 4A is a side elevation view of the non-elongated segment shown in FIG. 3A, the view from outside of the fence of FIG. 1.

FIG. 4A is a side elevation view of the non-elongated segment 12 from the outside of the first wall 10 of the containment fence. Thus, FIG. 4A shows the outside face 112 of wall segment 12. The outside face 112 meets the upper face (100 in FIG. 1A) of the first wall 10 along the line of the upper edge 400. The outside face 112 meets the lower face (190 in FIG. 1A) of the first wall 10 along the line of the lower edge 490. Also apparent in FIG. 4A are the protrusions 152 and 154. When attached to a circuit board, protrusions 152 and 154 engage corresponding holes in the circuit board, and lower edge 490 lies adjacent to the upper surface of the circuit board. Details of protrusion 152 are given in FIG. 4B.

Figure 4B:
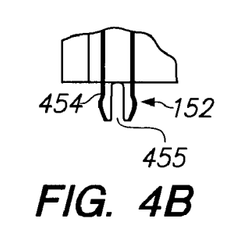
FIG. 4B is a side elevation view of a portion of the wall segment shown in FIG. 4A, illustrating details of a second protrusion.

FIG. 4B is a side elevation view of a portion of the wall segment 12 shown in FIG. 4A and illustrates details of protrusion 152. Protrusion 152 becomes wider at a collar 454 and narrows below that. Protrusion 152 also includes a vertical slot 455. The vertical slot 455 allows the protrusion 152 to flex in order to allow the collar 454 to pass a narrow neck in any hole into which the protrusion is inserted. After the collar 454 passes below a neck in a hole, the protrusion expands, thus locking the protrusion 152 in the hole. If the hole contains no neck, the protrusion 152 with the vertical slot 455 acts as a spring to press collar 454 against the sides of such a hole. The friction of the collar 454 on the sides of the hole is sufficient to engage the hole, and hold the lower face 190 of the first wall 10 adjacent to the upper surface of a circuit board until a potting fluid is poured inside the first wall 10 and cures to a desired hardness.

Figure 5A:
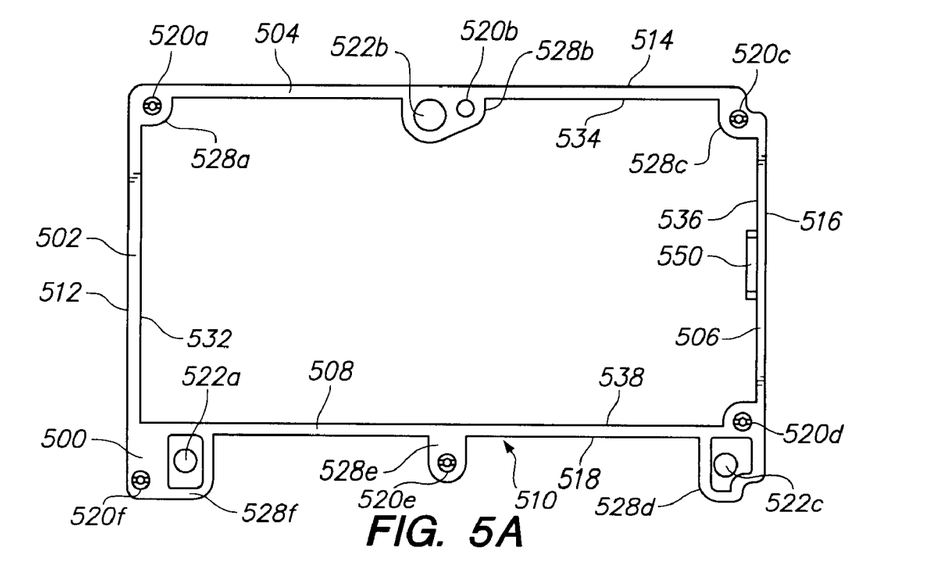
FIG. 5A is a top plan view of a second wall of the containment fence intended for use on the lower surface of a circuit board according the same embodiment of the invention as in FIG. 1.

FIG. 5A is a top plan view of a second wall 510 of the containment fence intended for use on the bottom surface of a circuit board. FIG. 5A shows the upper face 500 of the second wall 510. Wall segment 502 has outside face 512 and inside face 532, wall segment 504 has outside face 514 and inside face 534, wall segment 506 has outside face 516 and inside face 536, and wall segment 508 has outside face 518 and inside face 538. The second wall 510 is formed in a generally rectangular form for attachment to the perimeter of a lower face of a rectangular circuit board. In general, any two dimensional closed geometry, such as a polygon, may be used. The most important factor is that the shape of the inner face of the segments of the second wall 510 surround the area on the lower surface of the circuit board having components to be encased in the cured potting fluid. In the preferred embodiment, second wall 510 is formed as an integral unit made of material such as rigid polystyrene, ABS, other plastics, metals, ceramics, composites, etc. Porous or non-porous materials may be used. The material should be sufficiently rigid, but must also have sufficient elastic properties to allow for interlocking protuberances to mate. The material may have rigidity perpendicular to the board surface that improves the planarity of the board when it is sandwiched between the fences. The particular material is not critical, provided that it is rigid enough to contain a layer of resin or other viscous liquid material that is poured within its walls as the potting fluid during the potting process.

A plurality of protuberances 520a, 520b, 520c, 520d, 520e and 520f are disposed on the upper surface 500 of the second wall 510. The protuberances 520 are placed to align with the interlocking holes (120 in FIG. 1B) on the first wall (10 in FIG. 1B). Note that the second wall 510 of FIG. 5A is not drawn to the same scale as the first wall (10 in FIG. 1A and FIG. 1B), as can be detected by the distance between the protuberances 520 that correspond to the interlocking holes (120 in FIG. 1B). In particular, the length of the elongated segments 504 and 508 of the second wall 510 are less than the corresponding segments of the first wall (14 and 18 in FIG. 1B) although, in the drawings, the former appear larger than the latter.

An important consideration, in the placement of wall segments and bosses, is to surround components on the circuit board that are to be encased during the potting process, while avoiding components, including connections and attachment areas, that are not to be encased. Thus, the shape of the second wall 510 for the lower face of the circuit board may differ from the shape of the first wall (10 in FIG. 1A and FIG. 1B) because the components to be avoided on the lower surface of the circuit board differ from the components to be avoided on the upper surface of the circuit board. The shape of the second wall 510 is configured so that the protuberances 520 disposed on its upper face correspond to the interlocking holes on the first wall (10 in FIG. 1A). In a preferred embodiment, some of the protuberances 520 extend from a boss that extends inwardly from one of the wall segments, or on a-boss that extends outwardly from a wall segment. For example, protuberance 520b is disposed on the upper face of boss 528b, which extends inwardly from wall segment 504; and protuberance 520e is dispose on the upper face of boss 528e which extends outwardly from wall segment 508.

If the walls are properly configured to avoid circuit components not to be encased, as in the embodiment of FIG. 1 through FIG. 7, then pass through holes can be drilled in the circuit board to allow-the protuberances 520 to pass through the circuit board and engage the interlocking holes (120 in FIG. 1B) on the first wall (10 in FIG. 1B). In addition, attachment areas can still be accessed, either outside the walls, or in bosses between the inside and outside of the wall, where no potting fluid is poured. For example, attachment areas around 522a, 522b and 522c for the lower surface of the circuit board, corresponding to attachment areas for the upper surface of the circuit board (22a, 22b and 22c in FIG. 1A, respectively) are accessible through bosses 528f, 528b and 528d, respectively.

FIG. 5A also shows a visual marker 550 spaced apart from the upper surface 500 of the second wall 510. This visual marker 50 serves the function of indicating the potting fluid fill level when the lower surface of the circuit board undergoes the potting process. When the lower surface of the circuit board undergoes the potting process, the lower surface is turned to face upward so that gravity maintains the potting fluid within the second wall during pouring and at least some of the curing step. In the configuration when the bottom surface is turned upward, the visual marker 550 is above the lower surface of the circuit board and can function as the fill level. In the following description, relative positions are described as if the upper surface of the circuit board is facing up and the lower surface is facing down, unless otherwise stated.

Figure 5B:
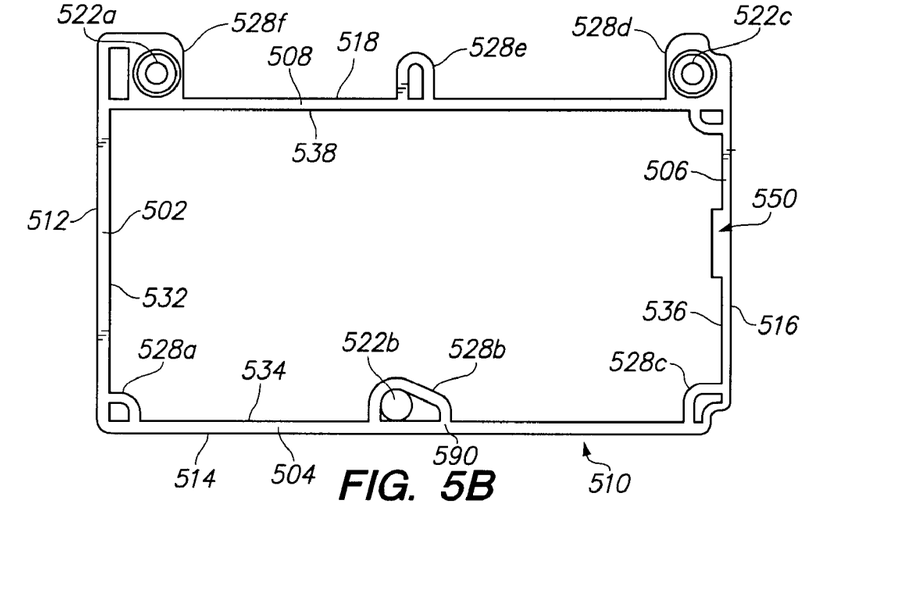
FIG. 5B is a bottom plan view of the second wall of the containment fence of FIG. 5A intended for use on the lower surface of the circuit board.

FIG. 5B is a bottom plan view of the second wall 510 of the containment fence intended for use on the lower surface of the circuit board. FIG. 5B shows the lower surface 590 of the second wall 510. Because of the reversed view used in FIG. 5B, corresponding features from the top plan view appear swapped in position; for example boss 528e appears at top of FIG. 5B, whereas it appears at the bottom of FIG. 5A. FIG. 5B shows the visual marker is flush with the lower surface 590 of the second wall 510. When the lower surface of the circuit board undergoes the potting process, the circuit board is turned bottom surface upward, and the lower surface depicted in FIG. 5B becomes the top of the containment fence while the potting fluid is poured over the lower surface of the circuit board. The potting fluid is poured to the level indicated by visual marker 550, in this case, flush with the surface 590 of the second wall 510.

Figure 6:
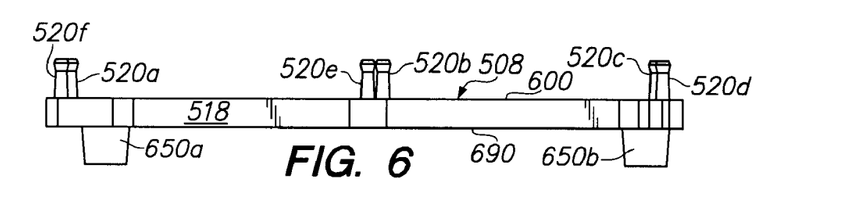
FIG. 6 is a side elevation view of an elongated segment of the fence of FIG. 5A.

FIG. 6 is a side elevation view of the elongated segment 508 of the second wall 510 of FIG. 5A and FIG. 5B. FIG. 6 shows outside face 518 of segment 508. The outside face 518 meets the upper face (500 in FIG. 5A) of the second wall 510 along the line of the upper edge 600. The outside face 518 meets the lower face (590 in FIG. 5B) of the second wall 510 along the line of the lower edge 690. Also apparent in FIG. 6 are the protuberances 520 and standoffs 650. Standoffs 650 are included in the preferred embodiment to further reduce costs by. eliminating the need for attaching separate standoffs to the circuit board. Standoffs keep an external device or element from contacting or coming too close to features on a circuit board, such as the surface of the case formed around the indicated components after the potting fluid cures and hardens.

Figure 7A:
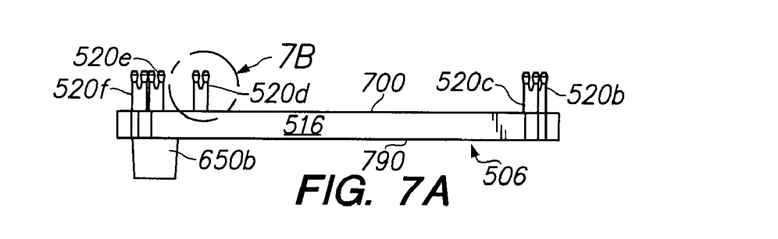
FIG. 7A is a side elevation view of a non-elongated segment of the second wall of FIG. 5A, the view from outside of the fence.

FIG. 7A is a side elevation view of a non-elongated segment 506 of the second wall 510 of the fence of FIG. 5A, as viewed from outside the fence. Thus FIG. 7A shows the outside face 516 of wall segment 506. The outside face 516 meets the upper face (500 in FIG. 5A) of the second wall 510 along the line of the upper edge 700. The outside face 516 meets the lower face (590 in FIG. 5B) of the second wall 510 along the line of the lower edge 790. Also apparent in FIG. 7A are the protuberances 520 and standoff 650b. When attached through a circuit board, protuberances 520 pass through the circuit board and engage corresponding interlocking holes (120 in FIG. 1B) on a lower face (190 in FIG. 1B) of the first wall (10 in FIG. 1B). In this configuration, the upper edge 700 lies adjacent to the lower surface of the circuit board. Details of protrusion 520d are given in FIG. 7B.

Figure 7B:
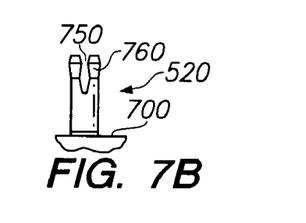
FIG. 7B is a side elevation view of a portion of the wall segment shown in FIG. 7A, illustrating details of a protuberance used to engage the interlocking hole of FIG. 3B.

FIG. 7B is a side elevation view of a portion of the wall segment 506 shown in FIG. 7A and illustrating details of a protuberance 520. Protuberance 520 becomes wider at a collar 760 and narrows above that. Protuberance 520 also includes a vertical slot 750. The vertical slot 750 allows the protuberance 520 to flex in order to the pass a narrow neck in an interlocking hole into which the protuberance is inserted. A protuberance and an interlocking hole make up a pair of interlocking elements; and either one is a complementary interlocking element for the other. After the collar 760 passes above a neck in a hole (such as neck 320 in FIG. 3B), the protuberance expands and is compressed as it passes through the neck. As a result, the protuberance collar 760 is snugly held, inhibiting or preventing removal of the protuberance from the interlocking hole. The distance from the collar 760 to the upper face of the second wall 510 (the upper face indicated by the upper edge 700) is matched to the sum of two other distances. The first distance in this sum is the thickness of the circuit board, through which the protuberance passes. The second distance in this sum is the distance from the lower surface 190 of the first wall 10 to the neck 320 of the interlocking hole 120 shown in FIG. 3B. This protuberance distance is matched to snugly hold the first and second walls to the intervening circuit board, when the three pieces are assembled. In particular, the geometry of the parts provides for a snug hold even when there is variation in the board thickness.

CIRCUIT CARD WITH A CONTAINMENT FENCE

Figure 8:
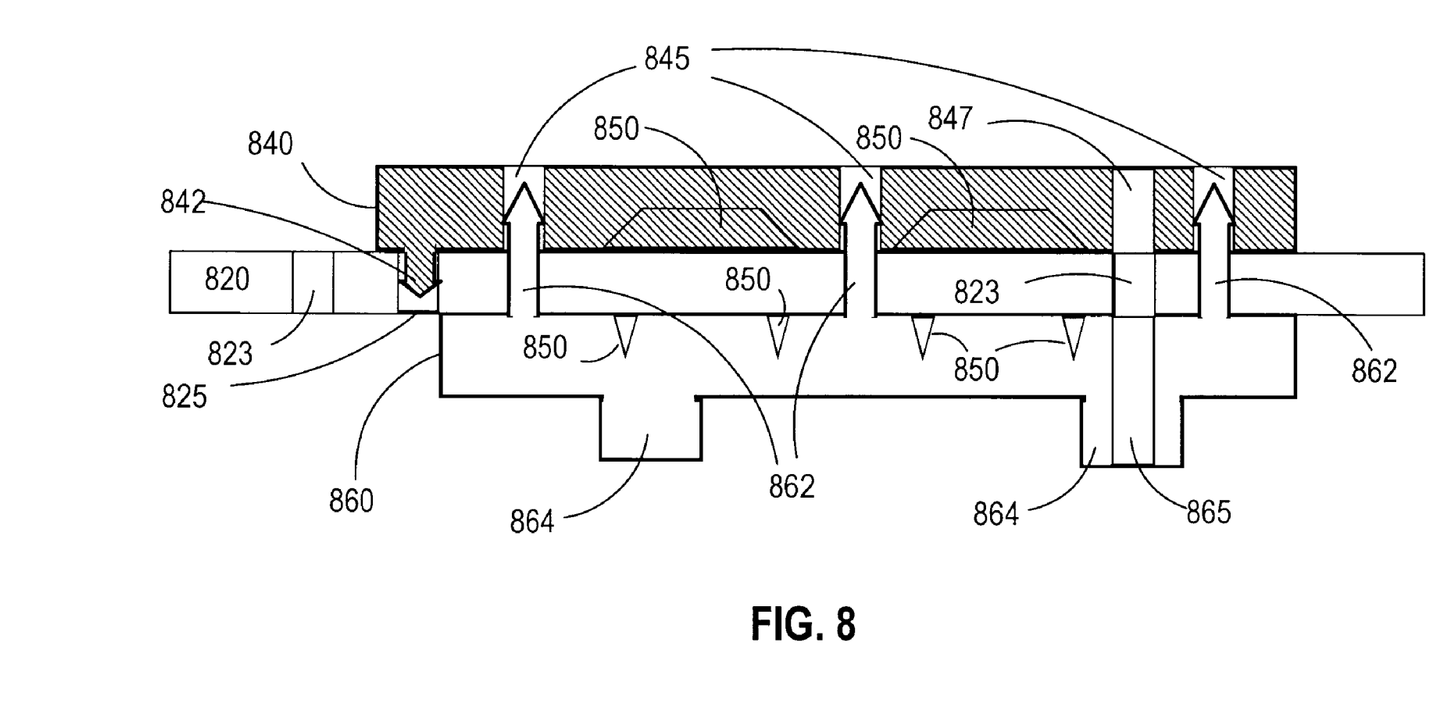
FIG. 8 is a schematic side elevation, sectional diagram of an assembled circuit card with a containment fence installed, according to another embodiment of the present invention.

FIG. 8 is a schematic side elevation, sectional diagram of an assembled circuit card with a containment fence installed according to another embodiment. The assembly includes circuit card 820, such as a circuit board that can be inserted into another device, and a containment fence comprising a first wall 840 and a second wall 860. The circuit card 820 includes a plurality of pass through holes 823 for attachment to other devices, and a plurality of pass through holes 825 for the containment fence. The first wall 840 includes a protrusion 842 inserted into a hole 825 to engage the circuit card and position the first wall 840 relative to the circuit card 820. The first wall 840 also includes a plurality of interlocking holes 845. The first wall 840 also includes a pass through hole 865 for attaching the assembly to another device while maintaining appropriate spacing from top to bottom of the assembly without the need for additional spacers. The second wall 860 includes a plurality of protuberances 862 which are inserted through the pass through holes 825 of the circuit card 820 and into the interlocking holes 845 of the first wall 840. The second wall 860 also includes a plurality of standoffs 864. One of the standoffs 864 includes a pass through hole 860, aligned with the pass through hole 847 in the first wall, for attaching the assembly to another device while maintaining appropriate spacing from top to bottom of the assembly. Components 850 encased in cured potting fluid inside the containment fence are also shown although these are behind the plane of the schematic section.

Although FIG. 8 shows the first wall 840 has all the interlocking holes 845 and the second wall 860 has all the complementary protuberances 862, any combination of holes and protuberances are used on either wall in other embodiments, as long as corresponding positions on the opposite wall have complementary interlocking elements. These other embodiments are too numerous to show explicitly. A person of ordinary skill in the art can understand from the above description how such embodiments can be formed.

POTTING METHOD

Figure 9:
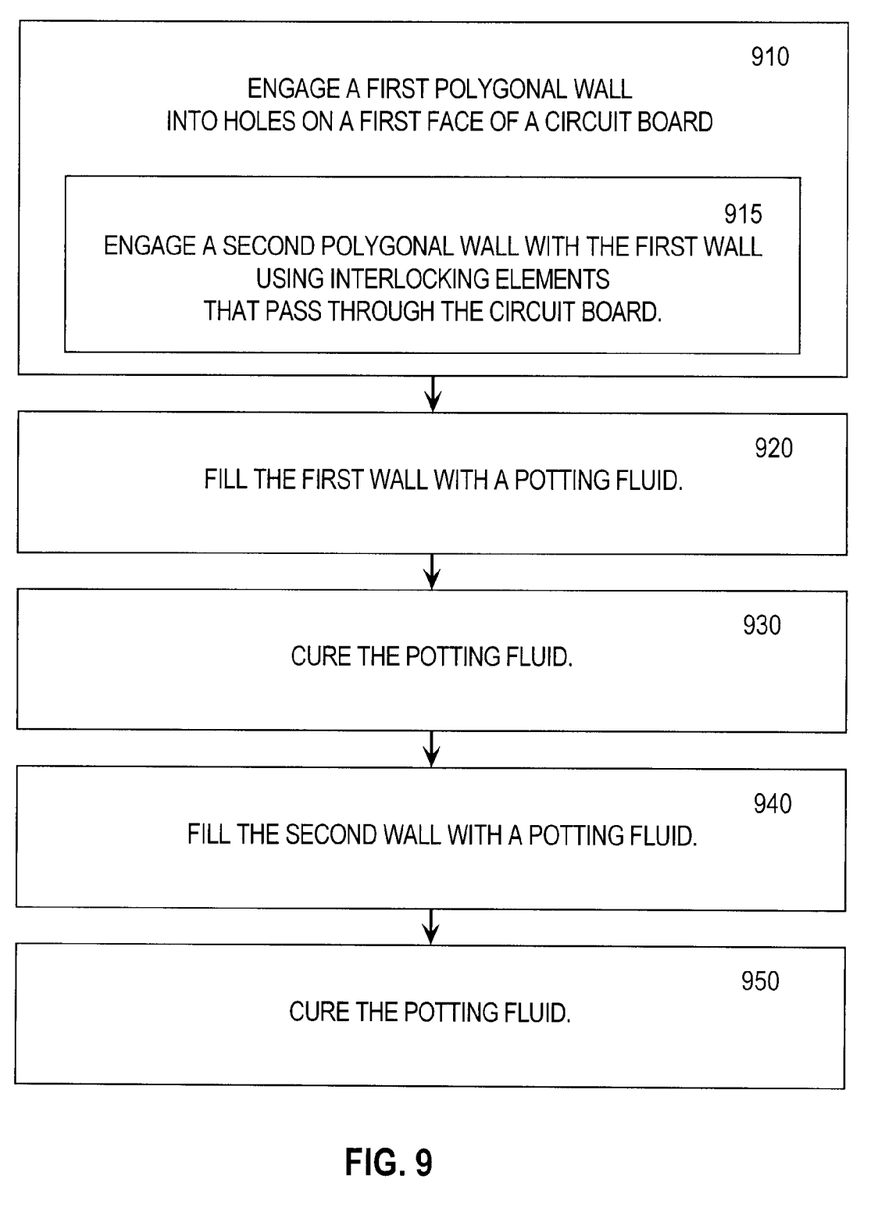
FIG. 9 is a flow chart showing steps in a method for encasing circuit components on either or both sides of a circuit board within cured potting fluid according to another embodiment of the present invention.

FIG. 9 is a flowchart showing steps in a method for encasing circuit components on either or both surfaces of a circuit board. In step 910 a first wall of a fence is engaged in holes on a circuit board to position the first wall around components on a first face of a circuit board to be encased in a potting process. In optional step 915, a second wall of the fence having interlocking elements is engaged through holes on a circuit board so that its interlocking elements engage complementary interlocking on the first wall of the fence and the second wall is positioned around components on the second face of a circuit board to be encased during a potting process. In step 920, the area inside the first wall is filled with a potting fluid up to a fill level indicated on the inside of the first wall, while the first face of the circuit board is up. In step 930, the recently poured potting fluid is cured until it hardens. If step 915 was performed, then steps 940 and 950 are also performed. In step 940, the area inside the second wall is filled with a potting fluid up to a fill level indicated on the inside of the second wall, while the second face of the circuit board is up. In step 950, the recently poured potting fluid is cured until it hardens.

In the foregoing specification, the invention has been described with reference to specific embodiments thereof. It will, however, be evident that various modifications and changes may be made thereto without departing from the broader spirit and scope of the invention as claimed in the following claims and their equivalents. The specification and drawings are, accordingly, to be regarded in an illustrative rather than a restrictive sense.

What is claimed is:

1. A circuit card comprising:
   a board having
      circuit components arranged on a first face of the board, components of the circuit components on the first face of the board encased in a cured potting fluid, and
      a cavity on the first face of the board; and
   a fence comprising a first wall including:
      a first plurality of segments disposed to form a closed polygonal wall providing containment for the cured potting fluid on the first face of the board;
      at least one protrusion for engaging the cavity, the at least one protrusion disposed on a face of the first wall adjacent to the first face; and
      at least one boss extending inwardly or outwardly from a segment of the first plurality of segments;
   wherein the first wall is formed of material which is rigid before any protrusion of the at least one protrusion is engaged in the cavity.

2. The circuit card of claim 1, the first wall further comprising a platform disposed to be substantially perpendicular to an inside face of the first wall, the platform spaced apart from a lower edge of the inside face of the first wall, for receiving a label at or above a fill level for the potting fluid.

3. The circuit card of claim 1, the fence further comprising one or more standoffs on an upper face of the first wall for keeping an external device from contacting an upper surface of the cured potting fluid.

4. A circuit card comprising:
   a board having
      circuit components arranged on both an upper face of the board and a lower face of the board, the components encased in a cured potting fluid, and
      at least one hole passing from the upper surface of the board to the lower surface of the board; and
   a fence comprising:
      a first wall having
         a first plurality of segments disposed to form a closed first polygon providing containment for the cured potting fluid on the upper face of the board, and
         at least one element of a pair of interlocking elements, the at least one element disposed on a lower face of the first wall; and
      a second wall having
         a second plurality of segments disposed to form a closed second polygon providing containment for the cured potting fluid on the lower face of the board, and
         at least one complementary element of the pair of interlocking elements, the complementary element disposed on an upper surface of the second wall, and
      wherein at least one of the first wall and the second wall includes a boss extending inwardly or outwardly from a segment of the respective plurality of segments;
      wherein the at least one element engages the at least one complementary element through a corresponding hole of the at least one hole.

5. The circuit card of claim 4, wherein at least one of the first wall and the second wall is pre-formed of a rigid material.

6. The circuit card of claim 4, wherein the first wall and the second wall are pre-formed of a rigid material.

7. The circuit card of claim 4, wherein at least one wall of the first wall and the second wall is pre-formed as an integral unit.

8. The circuit card of claim 4, wherein each wall of the first wall and the second wall is pre-formed as an integral unit.

9. The circuit card of claim 4, the fence further comprising a visual marker disposed along an inside face of a wall of the first wall and the second wall, the marker for marking a fill level for the potting fluid.

10. The circuit card of claim 9, the visual marker further comprising a platform substantially perpendicular to the inside face, the platform for receiving a label.

11. The circuit card of claim 4, the fence further comprising one or more standoffs on an upper face of the first wall for keeping an external device from contacting an upper surface of the cured potting fluid.

12. The circuit card of claim 4, the fence further comprising one or more standoffs on a lower face of the second wall for keeping an external device from contacting a lower surface of the cured potting fluid.

13. The circuit card of claim 4, the pair of interlocking elements further comprising:
   a protuberance having a vertical notch and a horizontal collar; and
   a cavity having a horizontal neck.

14. The circuit card of claim 4, wherein the potting fluid is epoxy.

15. A circuit card with encased circuit components, produced by:
   engaging, into holes on a circuit board, protrusions of a pre-formed polygonal fence of rigid material having a boss extending inwardly or outwardly from a fence wall, such that the polygonal fence surrounds the components to be encased;
   filling the area inside the fence with a potting fluid; and
   curing the potting fluid until it hardens.

16. A circuit card with encased circuit components on both sides of a circuit board, produced by:
   engaging, through holes on a circuit board, one or more interlocking elements of a pre-formed polygonal first wall of a fence of rigid material having a boss extending inwardly or outwardly from a fence wall, with corresponding one or more complementary interlocking elements of a pre-formed polygonal second wall of the fence, such that the first wall surrounds first components to be encased on a first face of the board and the second wall surrounds second components to be encased on a second face of the board;
   filling the area inside the first wall with potting fluid while the first face of the board is up;
   curing the potting fluid inside the first wall until it hardens;
   filling the area inside the second wall with a potting fluid while the second face of the board is up; and
   curing the potting fluid inside the second wall until it hardens.

\* \* \* \* \*